(12) United States Patent
Xu

(10) Patent No.: US 9,305,881 B2
(45) Date of Patent: Apr. 5, 2016

(54) GATE METAL STRUCTURE AND FORMING METHOD OF THE SAME

(71) Applicant: Shenzhen China Star Optoelectronics Technology Co., Ltd., Shenzhen, Guangdong (CN)

(72) Inventor: Xiangyang Xu, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 17 days.

(21) Appl. No.: 14/239,353

(22) PCT Filed: Jan. 6, 2014

(86) PCT No.: PCT/CN2014/070178
§ 371 (c)(1),
(2) Date: Feb. 18, 2014

(87) PCT Pub. No.: WO2015/089921
PCT Pub. Date: Jun. 25, 2015

(65) Prior Publication Data
US 2015/0214158 A1    Jul. 30, 2015

(30) Foreign Application Priority Data
Dec. 19, 2013  (CN) .......................... 2013 1 0702272

(51) Int. Cl.
*H01L 23/532* (2006.01)
*H01L 21/02* (2006.01)
*H01L 21/285* (2006.01)
*H01L 21/768* (2006.01)
*H01L 29/49* (2006.01)
*H01L 21/28* (2006.01)
*G02F 1/1362* (2006.01)

(52) U.S. Cl.
CPC ...... *H01L 23/53238* (2013.01); *H01L 21/0214* (2013.01); *H01L 21/02164* (2013.01); *H01L 21/28556* (2013.01); *H01L 21/28568* (2013.01); *H01L 21/76841* (2013.01); *G02F 2001/136295* (2013.01); *H01L 21/28008* (2013.01); *H01L 29/4908* (2013.01); *H01L 2924/0002* (2013.01)

(58) Field of Classification Search
CPC .................... H01L 21/0214; H01L 21/02164; H01L 21/28556; H01L 21/28568; H01L 21/76841; H01L 23/53238; H01L 21/28008; H01L 29/4908
See application file for complete search history.

(56) References Cited

U.S. PATENT DOCUMENTS

| | | | | |
|---|---|---|---|---|
| 7,015,152 B2* | 3/2006 | Callegari | .............. | C23C 16/403 257/300 |
| 7,144,808 B1* | 12/2006 | Aggarwal et al. | ............. | 438/675 |
| 2007/0278577 A1* | 12/2007 | Sakakura | .......... | H01L 29/66757 257/347 |
| 2009/0142905 A1* | 6/2009 | Yamazaki | ......... | H01L 21/76254 438/458 |

* cited by examiner

Primary Examiner — Nicholas Tobergte
(74) Attorney, Agent, or Firm — Andrew C. Cheng

(57) ABSTRACT

A gate metal structure and a forming method of the same are provided. The gate metal structure includes: a substrate and a copper metal layer; and a barrier layer disposed between the substrate and the copper metal layer, the barrier layer being formed of silicon oxynitride SiON or silicon oxide SiOx. By disposing a SiON or SiOx barrier layer between the substrate and the copper metal layer, conductivity and adhesion can be enhanced while reducing diffusion of copper when copper is used as the conductive metal layer material.

11 Claims, 2 Drawing Sheets

GATE METAL STRUCTURE AND FORMING METHOD OF THE SAME

CROSS REFERENCE TO RELATED APPLICATIONS

The present application claims priority to Chinese Patent Application No. 201310702272.1, filed Dec. 19, 2013, and entitled "gate metal structure and forming method of the same". The entire contents of the above-mentioned patent application are cited and incorporated herein for reference.

FIELD OF THE INVENTION

The present invention relates to a field of image display, and more particularly to a gate metal structure and a forming method thereof.

BACKGROUND OF THE INVENTION

With the development of flat panel display (FPD) technique, people have higher and higher requirements on resolution of a display and the refresh rate of a frame. Therefore, there are also urgent needs for developing new material and new techniques. The commonly used conductive metal layer material in current TFTLCDs is aluminum or molybdenum. The advantages of aluminum and molybdenum are simple film-forming process, good adhesion and flatness, soft and unlikely occurrence of climbing break, and little diffusion (film contamination). For a panel with a small size and low resolution, aluminum is the best choice for conductive metal layer material. However, for a large size and high resolution, aluminum becomes not satisfying due to relatively high resistivity. Serving as a conductive metal layer material, the conductivity of copper is far better than aluminum. Therefore, using copper instead of aluminum as conductive metal layer material can improve resolution and brightness of a panel. Meanwhile, frame flickering and line load can be lowered.

Unfortunately, the technique using copper as conductive metal layer material has problems in diffusion and adhesion. In order to solve the problems, as shown in FIG. 1, a barrier layer is commonly added between the conductive metal layer (Cu) and the substrate (generally glass). The barrier layer is formed of copper oxide (CuOx) for blocking the diffusion of copper. As shown in FIG. 2, if the CuOx layer is too thick, the diffusion of oxygen atom would affect the conductivity of copper after annealing at a high temperature. Therefore, it is required to form a relatively thin CuOx layer. As shown in FIG. 3, however, a thin CuOx layer cannot well anchor the Cu conductive metal layer.

SUMMARY OF THE INVENTION

The present invention aims to solve the technical problems and provides a gate metal structure and a forming method of the same, which enhance conductivity and adhesion while reducing diffusion as copper is used as the conductive metal layer material.

In order to solve the above problems, the present invention provides a gate metal structure, which comprises:
  a substrate and a copper metal layer; and
  a barrier layer disposed between the substrate and the copper metal layer, the barrier layer being formed of silicon oxynitride SiON or silicon oxide SiOx.

In the structure, the silicon oxynitride SiON or silicon oxide SiOx are participated between the substrate and the copper metal layer by way of a chemical vapor deposition process.

In the structure, the substrate is a glass substrate.

In the structure, the thickness of the barrier layer is 50 nm~200 nm.

In the structure, the copper metal layer is doped with rare metal, transition element or high melting-point metal, including one or more selected from a group consisting of dysprosium, samarium, gadolinium, neodymium, lanthanum, titanium, hafnium, niobium, zirconium, manganese, tungsten, tantalum, ruthenium, platinum and magnesium.

The present invention further provides a gate metal structure, which comprises:
  a substrate and a copper metal layer; and
  a barrier layer disposed between the substrate and the copper metal layer, the barrier layer being formed of silicon oxynitride SiON or silicon oxide SiOx, wherein the silicon oxynitride SiON or silicon oxide SiOx are participated between the substrate and the copper metal layer by way of a chemical vapor deposition process.

In the structure, the substrate is a glass substrate.

In the structure, the thickness of the barrier layer is 50 nm~200 nm.

In the structure, the copper metal layer is doped with rare metal, transition element or high melting-point metal, including one or more selected from a group consisting of dysprosium, samarium, gadolinium, neodymium, lanthanum, titanium, hafnium, niobium, zirconium, manganese, tungsten, tantalum, ruthenium, platinum and magnesium.

The present invention further provides a method for forming a gate metal structure, which comprises:
  a step S1 of providing a substrate and a copper metal layer; and
  a step S2 of disposing a barrier layer between the substrate and the copper metal layer, the barrier layer being formed of silicon oxynitride SiON or silicon oxide SiOx.

In the method, the step S2 is implemented by participating the silicon oxynitride SiON or silicon oxide SiOx between the substrate and the copper metal layer by way of a chemical vapor deposition process.

In the method, the substrate is a glass substrate.

In the method, the thickness of the barrier layer is 50 nm~200 nm.

In the method, the step S1 further comprises:
  doping the copper metal layer with rare metal, transition element or high melting-point metal, including one or more selected from a group consisting of dysprosium, samarium, gadolinium, neodymium, lanthanum, titanium, hafnium, niobium, zirconium, manganese, tungsten, tantalum, ruthenium, platinum and magnesium.

The gate metal structure and method for forming the same provided according to the present invention enhance conductivity and adhesion while reducing diffusion when using copper as the conductive metal layer material by disposing a SiON or SiOx barrier layer between the substrate and copper metal layers.

BRIEF DESCRIPTION OF THE DRAWINGS

The embodiments or technical solutions of the present invention will be apparent from the following detailed descriptions with reference to the attached drawings. It is understood that the attached drawings are merely for illustrating the embodiments of the present invention, and for those ordinary in the art, further drawings can be derived from the attached drawings without inventive efforts.

DETAILED DESCRIPTION OF THE PREFERRED EMBODIMENTS

Hereinafter, detailed descriptions of the invention are given with combined drawings and preferred embodiments.

Figure 1:
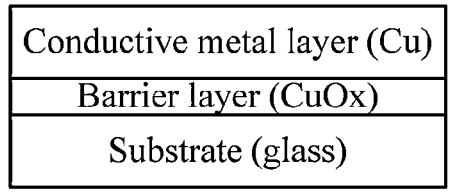
FIG. 1 is a schematic diagram showing the structure of an existing gate metal structure.
Figure 2:
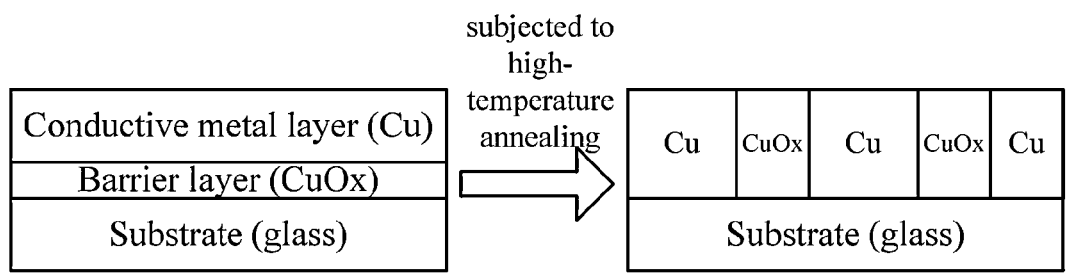
FIG. 2 is a schematic comparative diagram showing an existing gate metal structure before and after a high-temperature annealing process.
Figure 3:
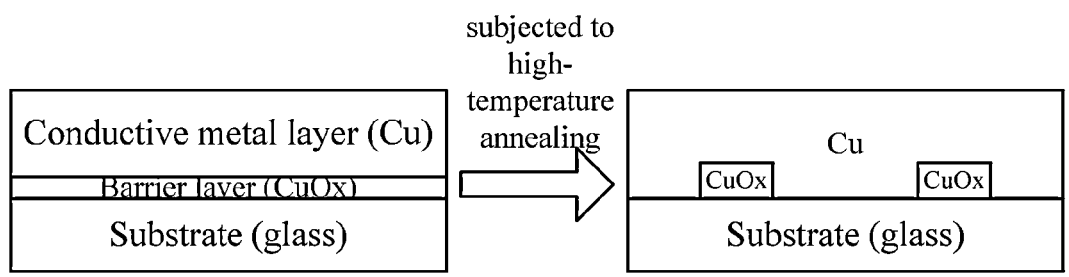
FIG. 3 is another schematic comparative diagram showing an existing gate metal structure before and after a high-temperature annealing process.
Figure 4:
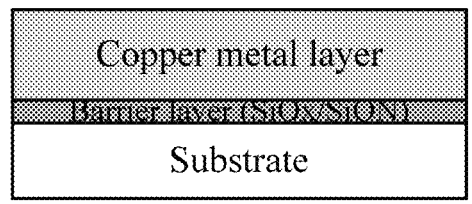
FIG. 4 is a schematic diagram showing a gate metal structure according to a first embodiment of the present invention.

Referring to the showing in FIG. 4, a gate metal structure provided according to a first embodiment of the present invention includes:

a substrate and a copper metal layer; and a barrier layer disposed between the substrate and the copper metal layer, the barrier layer being formed of silicon oxynitride SiON or silicon oxide SiOx.

In the structure, SiON/SiOx is a kind of inorganic non-metal insulating layer, and participated between the substrate and the copper metal layer by way of a chemical vapor deposition (CVD) process.

Figure 5:
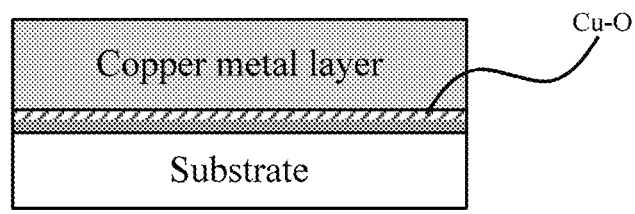
FIG. 5 is a schematic diagram showing the gate metal structure of the present embodiment shown in FIG. 4 after a high-temperature annealing process.

In this embodiment, SiON or SiOx is used as a barrier layer, which is far less dense than the substrate (particularly glass). The higher the density is, the more likely the diffusion occurs. Therefore, the diffusion probability can be significantly lowered due to the differentiation in properties of interface films. Meanwhile, as shown in FIG. 5, an oxygen atom in SiON/SiOx may combine with a copper atom in the copper metal layer to form a copper-oxygen bond (Cu—O), thereby enhancing the adhesion of Cu to SiON/SiOx.

SiON and SiOx differ in two main way. One is density, wherein SiON has a better density than SiOx; and the other is oxygen content, wherein SiOx has a higher oxygen content than SiON. Oxygen atoms may affect the property of Cu. Accordingly, when applied to this embodiment of the present invention, SiON is a better barrier layer, compared with the barrier layer SiOx.

To lessen the effect of the oxygen atoms on the conductivity of copper in the high-temperature annealing process, the barrier layer is relatively thin, and has a thickness of 50 nm~200 nm. As for the thickness of the copper metal layer, it depends on the requirement on resistance. On the other hand, the thickness of the substrate varies with the material of the substrate. For a glass substrate, the thickness is about 0.5~0.7 T.

It is to be noted that of there are too many oxygen atoms in the barrier layer, the diffusion probability of oxygen atoms increases in the high-temperature annealing process on one hand, which would largely affect the conductivity of copper, and a large amount of oxygen atoms will combine with copper to form more copper-oxygen bonds so as to enhance adhesion between copper and barrier layers on the other hand. On the contrary, if the amount of the oxygen atoms in the barrier layer is relatively small, the oxygen atom diffusion becomes less significant in the high-temperature annealing process, and the effect on the conductivity of copper becomes less significant as well. However, the copper-atom bonds resulting from combination of oxygen atoms and copper also decrease so as to affect the adhesion between copper and barrier layers. Therefore, they are two trade-off factors, and need to be balanced. With regards to material, SiON or SiOx selected to be the barrier layer in this embodiment can obtain the balance between conductivity and adhesion.

Since copper is likely to form bumps in a high temperature process, this is also an issue to be considered and solved when copper is selected to be the metal material of the conductive metal layer. In this embodiment, some impurities, including rare metal, transition element or high melting-point metal, e.g. one or more selected from a group consisting of dysprosium, samarium, gadolinium, neodymium, lanthanum, titanium, hafnium, niobium, zirconium, manganese, tungsten, tantalum, ruthenium, platinum and magnesium, are doped into the copper metal layer. Of course, with the increase of the amount of impurities, resistance is also raised. Therefore, the bump problem and the resistance problem need be balanced by selecting an appropriate amount of dopants.

Figure 6:
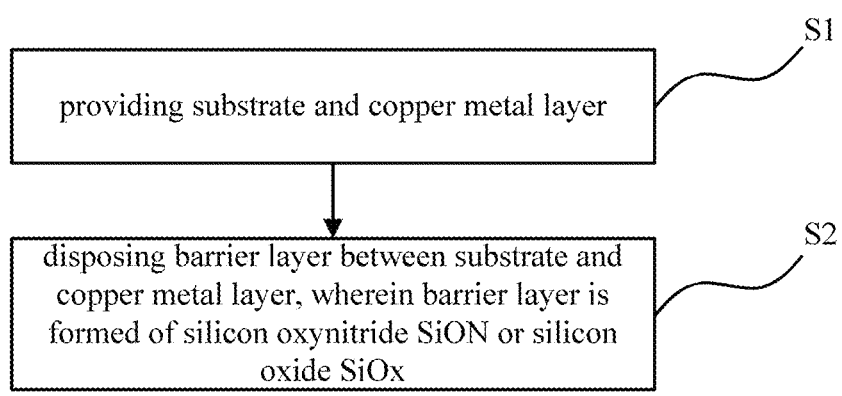
FIG. 6 is a flowchart showing a method for forming a gate metal structure according to a second embodiment of the present invention.

Further refer to FIG. 6. Corresponding to a gate metal structure according to the first embodiment of the present invention, a second embodiment of the present invention provides a method for forming the gate metal structure, which includes:

a step S1 of providing a substrate and a copper metal layer; and a step S2 of disposing a barrier layer between the substrate and the copper metal layer, the barrier layer being formed of silicon oxynitride SiON or silicon oxide SiOx.

In the method, the step S2 is implemented by participating the silicon oxynitride SiON or silicon oxide SiOx between the substrate and the copper metal layer by way of a chemical vapor deposition process. The substrate is preferably a glass substrate.

In this embodiment, SiON or SiOx is used as a barrier layer, which is far less dense than the substrate (particularly glass). The higher the density is, the more likely the diffusion occurs. Therefore, the diffusion probability can be significantly lowered due to the differentiation in properties of interface films. Meanwhile, as shown in FIG. 5, an oxygen atom in SiON/SiOx may combine with a copper atom in the copper metal layer to form a copper-oxygen bond (Cu—O), thereby enhancing the adhesion of Cu to SiON/SiOx.

SiON and SiOx differ in two main way. One is density, wherein SiON has a better density than SiOx; and the other is oxygen content, wherein SiOx has a higher oxygen content than SiON. Oxygen atoms may affect the property of Cu. Accordingly, when applied to this embodiment of the present invention, SiON is a better barrier layer, compared with the barrier layer SiOx.

To lessen the effect of the oxygen atoms on the conductivity of copper in the high-temperature annealing process, the barrier layer is relatively thin, and has a thickness of 50 nm~200 nm. As for the thickness of the copper metal layer, it depends on the requirement on resistance. On the other hand, the thickness of the substrate varies with the material of the substrate. For a glass substrate, the thickness is about 0.5~0.7 T.

Furthermore, since copper is likely to form bumps in a high temperature process, this is also an issue to be considered and solved when copper is selected to be the metal material of the conductive metal layer. In this embodiment, the step S1 further includes:

doping impurity molecules into the copper metal layer, including rare metal, transition element or high melting-point metal, and practically being one or more selected from a group consisting of dysprosium, samarium, gadolinium, neodymium, lanthanum, titanium, hafnium, niobium, zirconium, manganese, tungsten, tantalum, ruthenium, platinum and magnesium, are doped into the copper metal layer. Of course, with the increase of the amount of impurities, resistance is also raised. Therefore, the bump problem and the resistance problem need be balanced by selecting an appropriate amount of dopants.

The gate metal structure and method for forming the same provided according to the present invention enhance conductivity and adhesion while reducing diffusion when using copper as the conductive metal layer material by disposing a SiON or SiOx barrier layer between the substrate and copper metal layers.

Those disclosed above are only preferred embodiments according to the present invention and should not be used for limiting the scope of the invention. All the equivalent variations are considered within the scope of the invention.

What is claimed is:

1. A gate metal structure, comprising:
    a glass substrate and a copper metal layer; and
    a barrier layer disposed between the glass substrate and the copper metal layer, the barrier layer being formed of silicon oxynitride SiON or silicon oxide SiOx and in contact with the glass substrate and the copper metal layer,
    oxygen atoms in the barrier layer being combined with copper atoms in the copper metal layer to form copper-oxygen bonds between the barrier layer and the copper metal layer.

2. The gate metal structure according to claim 1, wherein the silicon oxynitride SiON or silicon oxide SiOx are participated between the glass substrate and the copper metal layer by way of a chemical vapor deposition process.

3. The gate metal structure according to claim 1, wherein the thickness of the barrier layer is 50 nm~200 nm.

4. The gate metal structure according to claim 1, wherein the copper metal layer is doped with rare metal, transition element or high melting-point metal, including one or more selected from a group consisting of dysprosium, samarium, gadolinium, neodymium, lanthanum, titanium, hafnium, niobium, zirconium, manganese, tungsten, tantalum, ruthenium, platinum and magnesium.

5. A gate metal structure, comprising:
    a glass substrate and a copper metal layer; and
    a barrier layer disposed between the glass substrate and the copper metal layer, the barrier layer being formed of silicon oxynitride SiON or silicon oxide SiOx and in contact with the glass substrate and the copper metal layer,
    wherein the silicon oxynitride SiON or silicon oxide SiOx are participated between the glass substrate and the copper metal layer by way of a chemical vapor deposition process, oxygen atoms in the barrier layer being combined with copper atoms in the copper metal layer to form copper-oxygen bonds between the barrier layer and the copper metal layer.

6. The gate metal structure according to claim 5, wherein the thickness of the barrier layer is 50 nm~200 nm.

7. The gate metal structure according to claim 5, wherein the copper metal layer is doped with rare metal, transition element or high melting-point metal, including one or more selected from a group consisting of dysprosium, samarium, gadolinium, neodymium, lanthanum, titanium, hafnium, niobium, zirconium, manganese, tungsten, tantalum, ruthenium, platinum and magnesium.

8. A method for forming a gate metal structure, comprising:
    a step S1 of providing a glass substrate and a copper metal layer;
    a step S2 of disposing a barrier layer between the glass substrate and the copper metal layer, the barrier layer being formed of silicon oxynitride SiON or silicon oxide SiOx and in contact with the glass substrate and the copper metal layer; and
    a step S3 of combining oxygen atoms in the barrier layer with copper atoms in the copper metal layer to form copper-oxygen bonds between the barrier layer and the copper metal layer.

9. The method for forming a gate metal structure according to claim 8, wherein the step S2 is implemented by participating the silicon oxynitride SiON or silicon oxide SiOx between the glass substrate and the copper metal layer by way of a chemical vapor deposition process.

10. The method for forming a gate metal structure according to claim 8, wherein the thickness of the barrier layer is 50 nm~200 nm.

11. The method for forming a gate metal structure according to claim 8, wherein the step S1 further comprises:
    doping the copper metal layer with rare metal, transition element or high melting-point metal, including one or more selected from a group consisting of dysprosium, samarium, gadolinium, neodymium, lanthanum, titanium, hafnium, niobium, zirconium, manganese, tungsten, tantalum, ruthenium, platinum and magnesium.

* * * * *